US 11,694,879 B2

(12) United States Patent
Widlow et al.

(10) Patent No.: US 11,694,879 B2
(45) Date of Patent: Jul. 4, 2023

(54) COMPONENT, METHOD OF MANUFACTURING THE COMPONENT, AND METHOD OF CLEANING THE COMPONENT

(71) Applicant: Applied Materials, Inc., Santa Clara, CA (US)

(72) Inventors: Ian Widlow, Santa Clara, CA (US); Govinda Raj, Santa Clara, CA (US); Gary U. Keppers, Morgan Hill, CA (US); Aravind Dugganna Naik, Bangalore (IN); Francisco Rodarte, Fremont, CA (US); Sudhir R. Gondhalekar, Pleasanton, CA (US); Ravikumara Kodinaganhalli, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 658 days.

(21) Appl. No.: 16/664,620

(22) Filed: Oct. 25, 2019

(65) Prior Publication Data
US 2020/0185202 A1 Jun. 11, 2020

Related U.S. Application Data

(60) Provisional application No. 62/849,699, filed on May 17, 2019, provisional application No. 62/802,562, (Continued)

(51) Int. Cl.
*H01J 37/32* (2006.01)
*C23C 16/44* (2006.01)

(52) U.S. Cl.
CPC .... *H01J 37/32642* (2013.01); *C23C 16/4404* (2013.01); *C23C 16/4405* (2013.01);
(Continued)

(58) Field of Classification Search
CPC .......... H01J 37/32642; H01J 37/32449; H01J 37/32477; H01J 37/32862; C23C 16/4404;
(Continued)

(56) References Cited

U.S. PATENT DOCUMENTS 5,660,640 A    8/1997 Laube
5,792,272 A * 8/1998 van Os ................ C23C 16/455
                                                                118/723 R (Continued)

FOREIGN PATENT DOCUMENTS

EP         2666966 A2 * 11/2013 ............. F01D 5/187
JP        H11514499 A * 12/1999
(Continued)

OTHER PUBLICATIONS

International Search Report and the Written Opinion of the International Searching Authority for PCT/US2019/058164 dated Feb. 17, 2020, 12 pages.

(Continued)

*Primary Examiner* — Jeffrie R Lund
(74) *Attorney, Agent, or Firm* — Patterson + Sheridan, LLP

(57) ABSTRACT

A component, a method of manufacturing a component, and a method of cleaning a component is provided. The component includes a gas flow system within the component, wherein the gas flow system fluidly couples one or more inlet holes and one or more outlet holes. The manufacturing of the component results in an arc shaped groove and a circumferential groove created in the body of the ring. The component undergoes one or more cleaning operations, including rinsing, baking, or purging operations. The cleaning operations remove debris or particles in or on the component, where the debris or particles can be caused (Continued)

during manufacturing of the component, or during use of the component in a semiconductor processing system.

19 Claims, 10 Drawing Sheets

Related U.S. Application Data filed on Feb. 7, 2019, provisional application No. 62/776,986, filed on Dec. 7, 2018.

(52) U.S. Cl.
CPC ...... *C23C 16/4407* (2013.01); *C23C 16/4409* (2013.01); *H01J 37/32449* (2013.01); *H01J 37/32477* (2013.01); *H01J 37/32862* (2013.01)

(58) Field of Classification Search
CPC ............ C23C 16/4405; C23C 16/4407; C23C 16/4409; C23C 16/45578; C23C 16/4558; H01L 21/67051; H01L 21/67017; H01L 21/67023; H01L 21/68721; H01L 21/02263; H01L 21/02312; H01L 21/02337; H01L 21/28556; H01L 21/67126
USPC ....................................................... 118/715
See application file for complete search history.

(56) References Cited

U.S. PATENT DOCUMENTS

| | | | | |
|---|---|---|---|---|
| 5,851,294 | A * | 12/1998 | Young | C23C 16/4558 156/345.33 |
| 7,674,394 | B2 * | 3/2010 | Paterson | H01J 37/321 438/689 |
| 7,794,667 | B2 | 9/2010 | Nishikawa et al. | |
| 9,679,749 | B2 * | 6/2017 | Angelov | C23C 16/4411 |
| 11,560,913 | B2 * | 1/2023 | Raj | C04B 37/023 |
| 2003/0211757 | A1 * | 11/2003 | Gondhalekar | C23C 16/466 156/345.43 |
| 2003/0213434 | A1 * | 11/2003 | Gondhalekar | H01J 37/32522 118/724 |
| 2003/0213562 | A1 * | 11/2003 | Gondhalekar | C23C 16/4401 156/345.48 |
| 2004/0099378 | A1 * | 5/2004 | Kim | C23C 16/4558 156/345.33 |
| 2004/0126952 | A1 * | 7/2004 | Gondhalekar | H01L 21/67017 438/200 |
| 2004/0231798 | A1 * | 11/2004 | Gondhalekar | H01L 21/67109 156/345.33 |
| 2006/0113038 | A1 * | 6/2006 | Gondhalekar | C23C 16/4558 156/345.33 |
| 2007/0087296 | A1 * | 4/2007 | Kim | C23C 16/45508 431/181 |
| 2009/0034147 | A1 * | 2/2009 | Narendrnath | H01L 21/6831 279/128 |
| 2009/0266299 | A1 * | 10/2009 | Rasheed | C23C 16/4581 118/723 R |
| 2010/0095979 | A1 * | 4/2010 | Hua | B08B 7/0035 134/1.2 |
| 2011/0146909 | A1 | 6/2011 | Shih et al. | |
| 2015/0118416 | A1 * | 4/2015 | Jang | H01J 37/3222 118/723 AN |
| 2018/0082863 | A1 | 3/2018 | Lin et al. | |
| 2020/0126819 | A1 * | 4/2020 | Ahn | C23C 16/45565 |
| 2020/0185202 | A1 * | 6/2020 | Widlow | H01J 37/32642 |

FOREIGN PATENT DOCUMENTS

| | | |
|---|---|---|
| JP | 2013226540 A | 11/2013 |
| KR | 100862658 B1 | 10/2008 |
| KR | 10-2016-0037120 A | 4/2016 |
| TW | I289610 B * | 11/2007 |

OTHER PUBLICATIONS

<https://www.kvt-fastening.at/-/media/kvt/download-center/catalogs/kataloge_en/kvt_koenig-expander_plugs_overview_en_08-2017_web-catalog.pdf>, Koenig Expander Catalog, retrieved Mar. 14, 2019.
<https://www.coburg.co.uk/en/page/sealing-plugs>, Coburg Components Sealing Plugs, retrieved Mar. 14, 2019.
<https://www.halder.com/eng/content/download/290903/18803074/file/Assembly_Instructions_Expander_Sealing_Plugs__31846.pdf>, Halder Expander Instructions, retrieved Mar. 14, 2019.

* cited by examiner

COMPONENT, METHOD OF MANUFACTURING THE COMPONENT, AND METHOD OF CLEANING THE COMPONENT

CROSS-REFERENCE TO RELATED APPLICATIONS

This application claims priority to U.S. Provisional Patent Application No. 62/776,986, filed Dec. 7, 2018, U.S. Provisional Patent Application No. 62/802,562, filed Feb. 7, 2019, and U.S. Provisional Patent Application No. 62/849,699, filed May 17, 2019, each of which are incorporated by reference in their entireties.

BACKGROUND

Field

Embodiments of the invention relate to component and a method and, more specifically, to a processing chamber component, a method of manufacturing a processing chamber component, and a method of cleaning a processing chamber component.

Description of the Related Art

Substrate processing typically involves the formation of one or more layers on substrates. Generally, substrates, e.g., silicon wafers, are placed on a pedestal in a semiconductor processing reactor. Process gas is introduced into the semiconductor processing reactor, and a layer is formed on the substrates from the process gas. To ensure uniformity in the characteristics of the layers formed on the substrates, it is important that each formed layer is uniform, e.g., in thickness, across a substrate. To enhance the uniformity of the formed layer, the pedestal upon which the substrates are placed is often rotated within the semiconductor processing chamber.

Typically, a gas delivery system is located above the substrate in the semiconductor processing chamber, and process gas injected by the gas delivery device (e.g., showerhead) descends onto a surface of the substrate in an even manner. The gas delivery system generally contains a variety of channels through which the process gas flows, beginning from the gas injector, and ending in a number of injection valves.

In order to maintain an even coverage of deposition on the substrate below, components in the processing system must be kept free of debris, and thus components require frequent cleaning. One drawback of manufacturing and cleaning components in the current art is that debris is often formed by flowing process gas through normal use of the processing chamber. Debris or residue formed on or in the components prevents their proper functioning. For example, debris can form in the channels of a gas delivery device such as a ring or showerhead, which results in an uneven flow of the gas delivered by the gas delivery system, in turn leading to an uneven growth of material on the substrate. In addition, debris can be created during manufacturing of the component itself, causing the component to malfunction upon first use.

Therefore, there is need in the art for a semiconductor processing component free of debris, a method of manufacturing of a component that prevents buildup of residue or debris, and a method of cleaning a component that effectively removes debris or residue.

SUMMARY

In one embodiment, a ring is provided, including a body, and a gas flow system disposed within the body. The gas flow system includes an arc shaped groove, a circumferential groove, one or more inner channels that fluidly couple the circumferential groove to the arc shaped groove and a plurality of nozzle regions, wherein the plurality of nozzle regions are disposed at an inner surface of the body, and are each fluidly coupled to the circumferential groove by a nozzle channel. The circumferential groove has a smaller radius than a radius of the arc shaped groove.

In another embodiment, a method for manufacturing a ring is provided, including forming a gas flow system in a body of the ring, the gas flow system including an arc shaped groove, a circumferential groove, one or more inner channels that fluidly couple the circumferential groove to the arc shaped groove and a plurality of nozzle regions, wherein the plurality of nozzle regions are disposed at an inner surface of the body, and are each fluidly coupled to the circumferential groove by a nozzle channel, and the circumferential groove has a smaller radius than a radius of the arc shaped groove, and depositing a circumferential groove coating and an arc shaped groove coating, wherein the circumferential groove coating is disposed over at least a portion of the circumferential groove, and the arc shaped groove coating is disposed over at least a portion of the arc shaped groove.

In another embodiment, a method of cleaning a component is provided, including rinsing the component with a first rinsing chemical for a first rinsing time, the component having one or more inlet holes in the component, one or more outlet holes in the component, and a gas flow system within the component, wherein the gas flow system fluidly couples the one or more inlet holes and the one or more outlet holes, the first rinsing chemical delivered with a first rinsing pressure, the first rinsing chemical delivered into the one or more inlet holes, through the gas flow system, and through the one or more outlet holes, purging the component with a first purge gas for a first purge time, the first purge gas delivered with a first purge pressure, the first purge gas delivered into the one or more inlet holes, through the gas flow system, and through the one or more outlet holes, and rinsing the component with a second rinsing chemical while heating the component to a rinsing temperature for a second rinse time, wherein the second rinsing chemical comprises deionized water, and wherein the rinsing the component comprises exposing the component to ultrasonic vibrations.

The gas delivery ring includes an arc shaped groove and a circumferential groove. Each groove is coated, and this coating prevents unwanted reactions between the body of the ring and a process gas, preventing the formation of unwanted debris or residue that can partially or completely obstruct the arc shaped groove or the circumferential groove, which results in uneven flow of the process gas, thus resulting in uneven growth on the substrate. The cleaning operations use combination of chemistries, ultrasound, purge gases, and elevated temperatures to effectively remove residue of different compositions from the outside and inside of the component. The combination and succession of multiple cleaning operations improves cleaning of the component and removes unwanted residue and particles.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include a gas delivery ring, a method of manufacturing a gas delivery ring, and a process of cleaning a component. In some embodiments, a gas delivery ring contains a number of channels, such that a process gas can be flowed through the channels and delivered to a substrate. The channels are coated with a material, which helps prevent the unwanted formation of residue or debris in the channels during the manufacturing process, which will generate particles and prevent or restrict a flow of a process gas through the channels. In some embodiments, a component is subjected to one or more cleaning operations. The cleaning operations include rinsing, etching, baking, and purge operations. The operations in concert remove unwanted particles and residues on the surface of the component or in internal portions of the component that can interfere with proper functioning of the component. Embodiments of the disclosure provided herein may be especially useful for, but are not limited to, improving the gas flow capabilities of a gas delivery ring in a semiconductor processing system.

As used herein, the term "about" refers to a +/−10% variation from the nominal value. It is to be understood that such a variation can be included in any value provided herein.

Manufacturing a Component

Figure 1A:
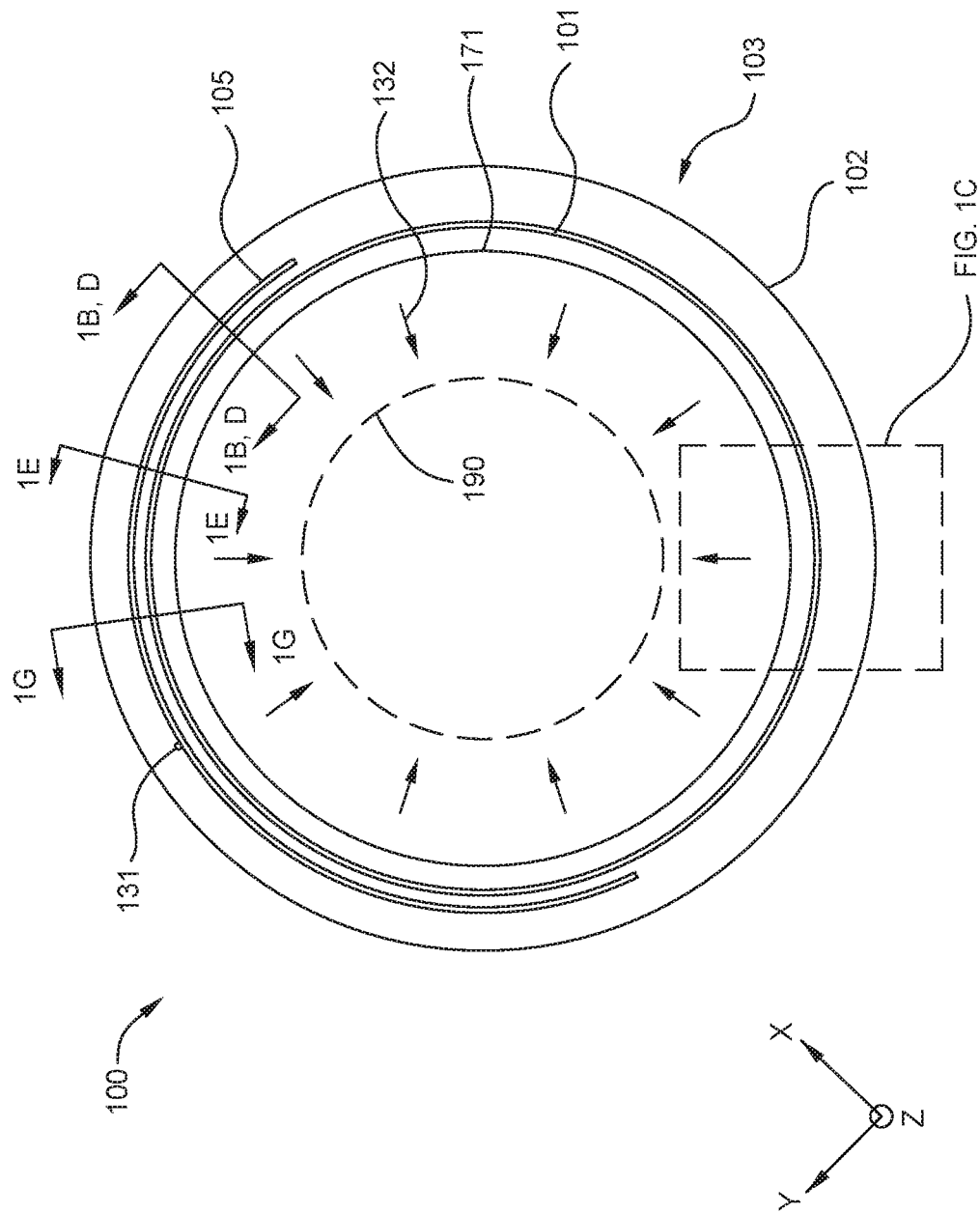
FIG. 1A illustrates a top view of a gas delivery ring, according to one embodiment.
Figure 1B:
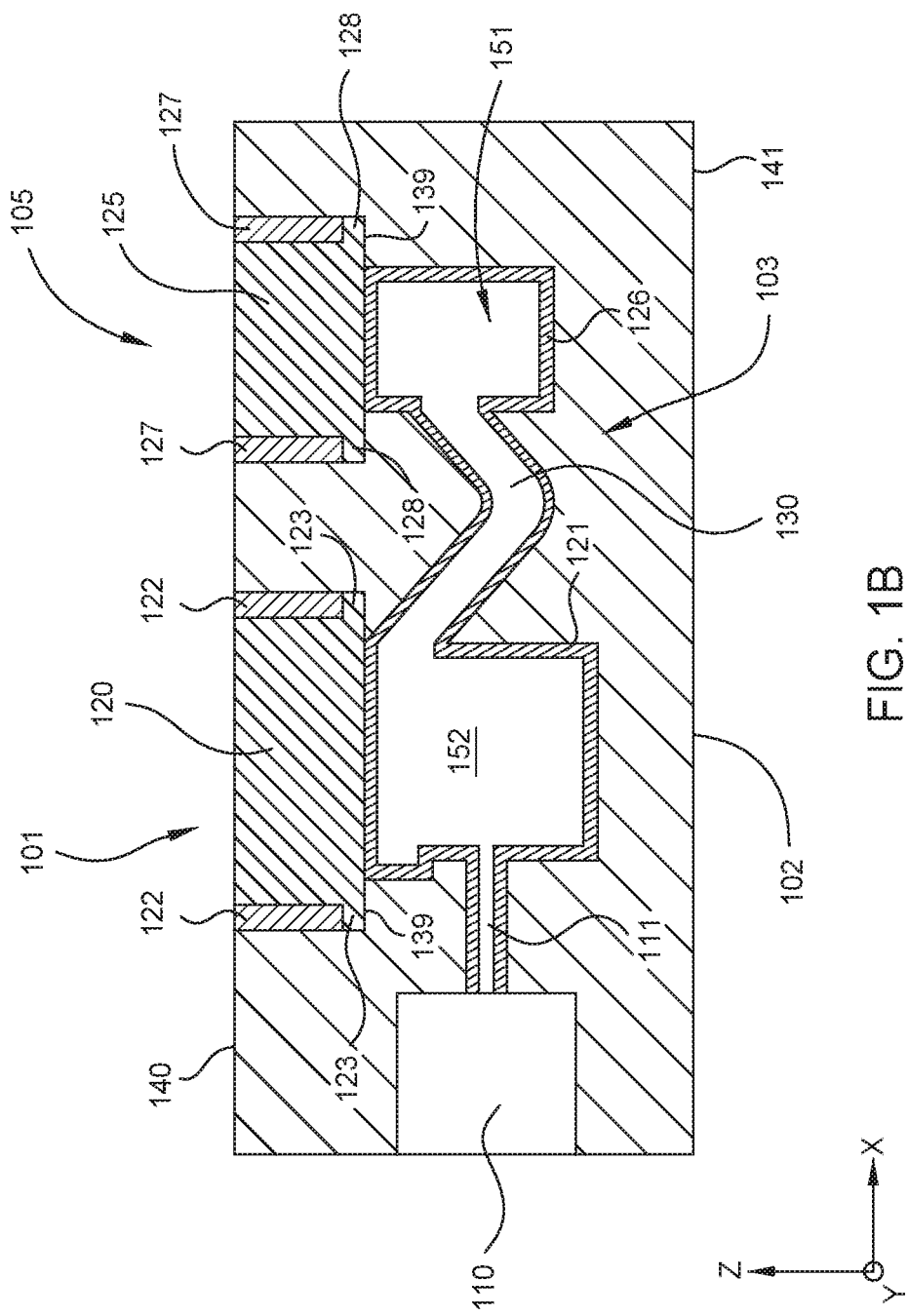
FIG. 1B illustrates a schematic side cross-sectional view of a portion of the ring of FIG. 1A, according to one embodiment.
Figure 1C:
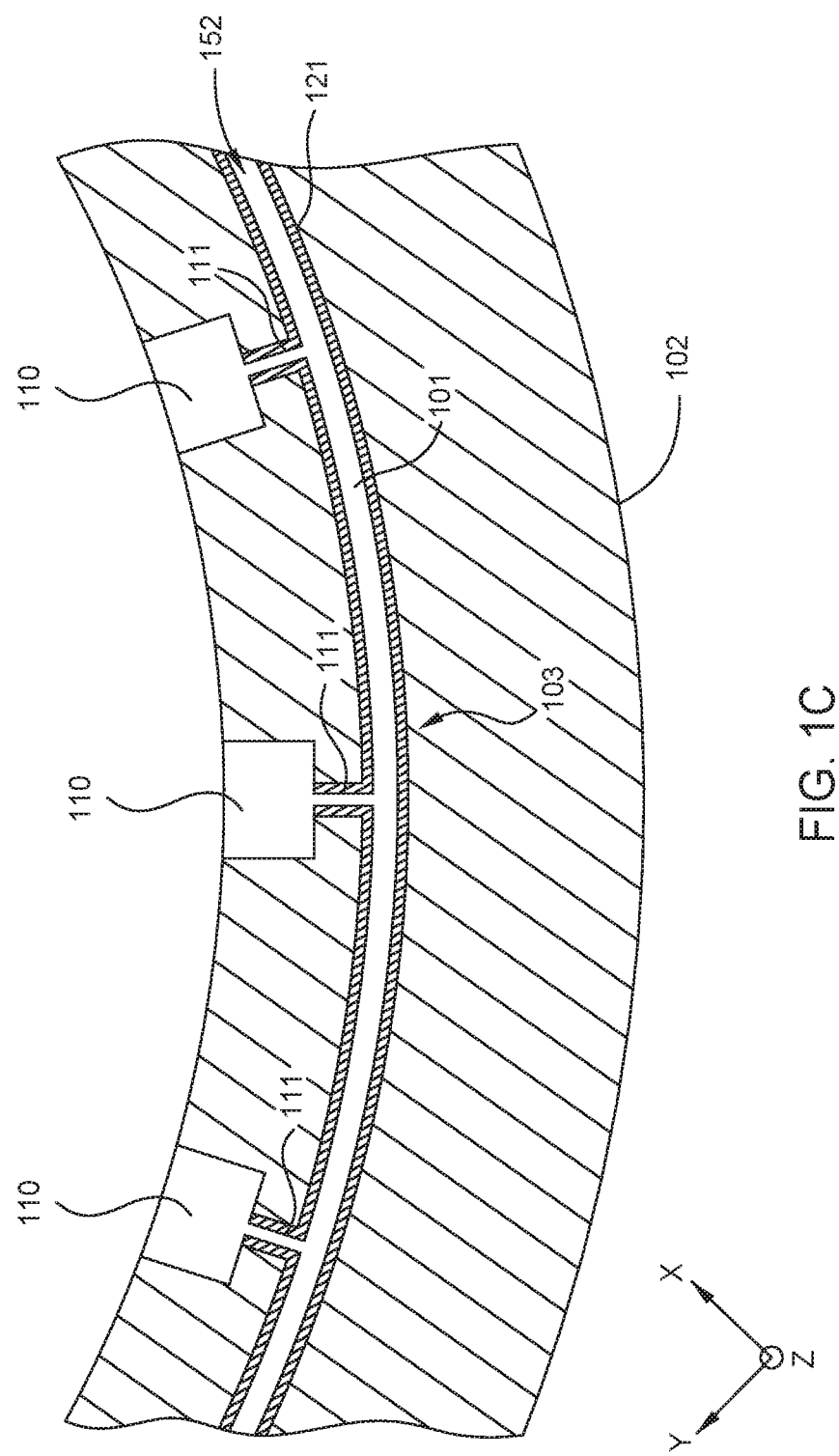
FIG. 1C illustrates a schematic top cross-sectional view of a portion of the ring of FIG. 1A, according to one embodiment.

FIG. 1A illustrates a top view of a gas delivery ring 100, according to one embodiment. FIG. 1B illustrates a schematic side cross-sectional view of a portion of the ring 100 using the sectioning line 1B-1B shown in FIG. 1A, according to one embodiment. FIG. 1C illustrates a schematic top cross-sectional view of a portion of the ring 100 shown in FIG. 1A that is formed by sectioning the ring 100 using an X-Y sectioning plane that passes through the vertical center (Z-direction center) of two or more of nozzle channels 111, according to one embodiment. As shown in FIG. 1A, the ring 100 includes a body 102 and a gas flow system 103. The gas flow system 103 includes a variety of channels and grooves that deliver a process gas 132 to the center of the ring 100 where a substrate 190 may be disposed during processing in a substrate processing chamber (not shown) in which the ring is disposed. The ring 100 can be made of a metal, or ceramic material. The ring 100 is made of stainless steel or quartz, according to one embodiment. The ring 100 includes aluminum (Al), according to one embodiment. The ring 100 is made of 6061 aluminum alloy, according to one embodiment.

During processing in a substrate processing chamber (not shown), a substrate 190 is disposed in the center of the ring. In some embodiments, the substrate 190 is a bare silicon or germanium wafer. In another embodiment, the substrate 190 further includes a thin film. The substrate 190 can be a photomask, a semiconductor wafer, or other workpiece known to one of ordinary skill in the art of electronic device manufacturing. The substrate 190 includes any material to make any of integrated circuits, passive (e.g., capacitors, inductors) and active (e.g., transistors, photo detectors, lasers, diodes) microelectronic devices, according to some embodiments. The substrate 190 includes insulating (e.g., dielectric) materials that separate such active and passive microelectronic devices from a conducting layer or layers that are formed on top of them, according to one embodiment.

The ring 100 delivers a flow of a process gas 132 to a surface of the substrate 190. The flow of the process gas 132 from nozzle regions 110 (FIG. 1C) of the ring may be in a radial direction as shown in FIG. 1A, or in a direction that is at an angle relative to a radius of the inner diameter 171 of the ring 100. The process gas 132 includes one or more chemicals to deposit a thin film on the substrate 190 using chemical vapor deposition (CVD), according to one embodiment. The process gas includes ammonia ($NH_3$) or nitrogen gas ($N_2$), according to one embodiment. The process gas 132 includes one or more chemicals to deposit a thin film on the substrate 190 using atomic layer deposition (ALD), according to one embodiment. The process gas 132 includes one or more chemicals to treat a thin film grown on the substrate 190, according to one embodiment. The positioning of the substrate 190 in the center of the ring 100 provides a desired flow of the process gas 132 across the substrate surface, such as a uniform flow of the process gas 132 across the substrate surface.

Figure 1D:
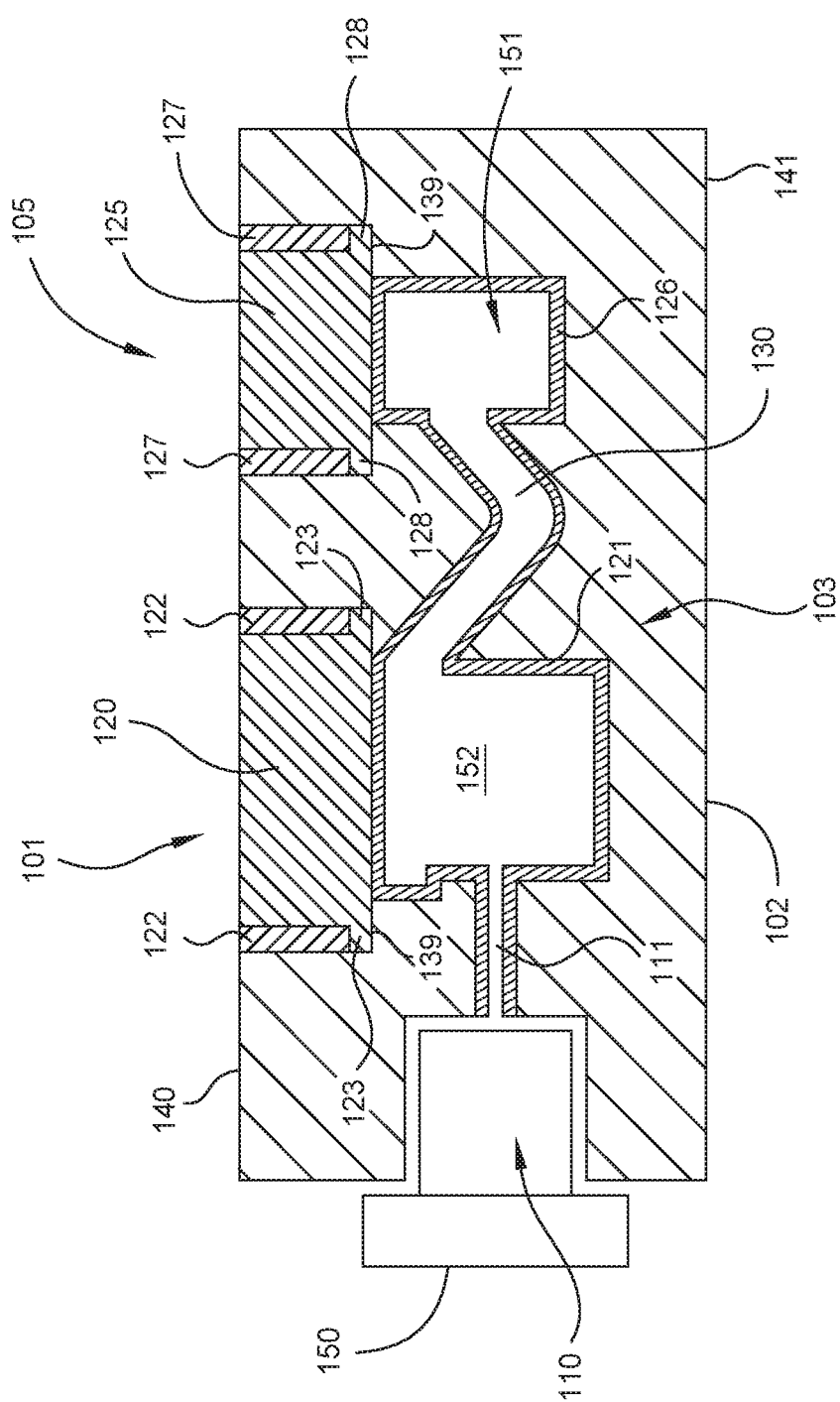
FIG. 1D illustrates a schematic side cross-sectional view of the portion of the ring of FIG. 1B with a nozzle, according to one embodiment.
Figure 1E:
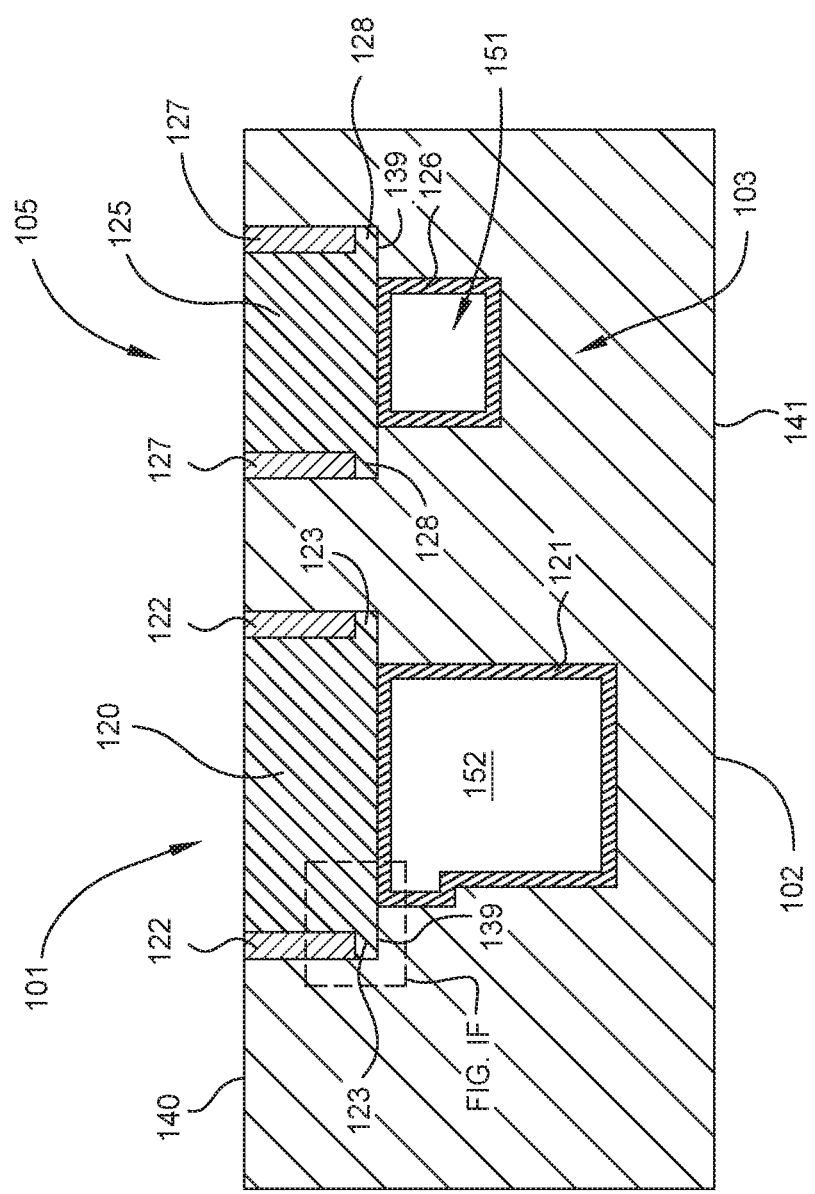
FIG. 1E illustrates a schematic side cross-sectional view of a portion of the ring of FIG. 1A, according to one embodiment.
Figure 1F:
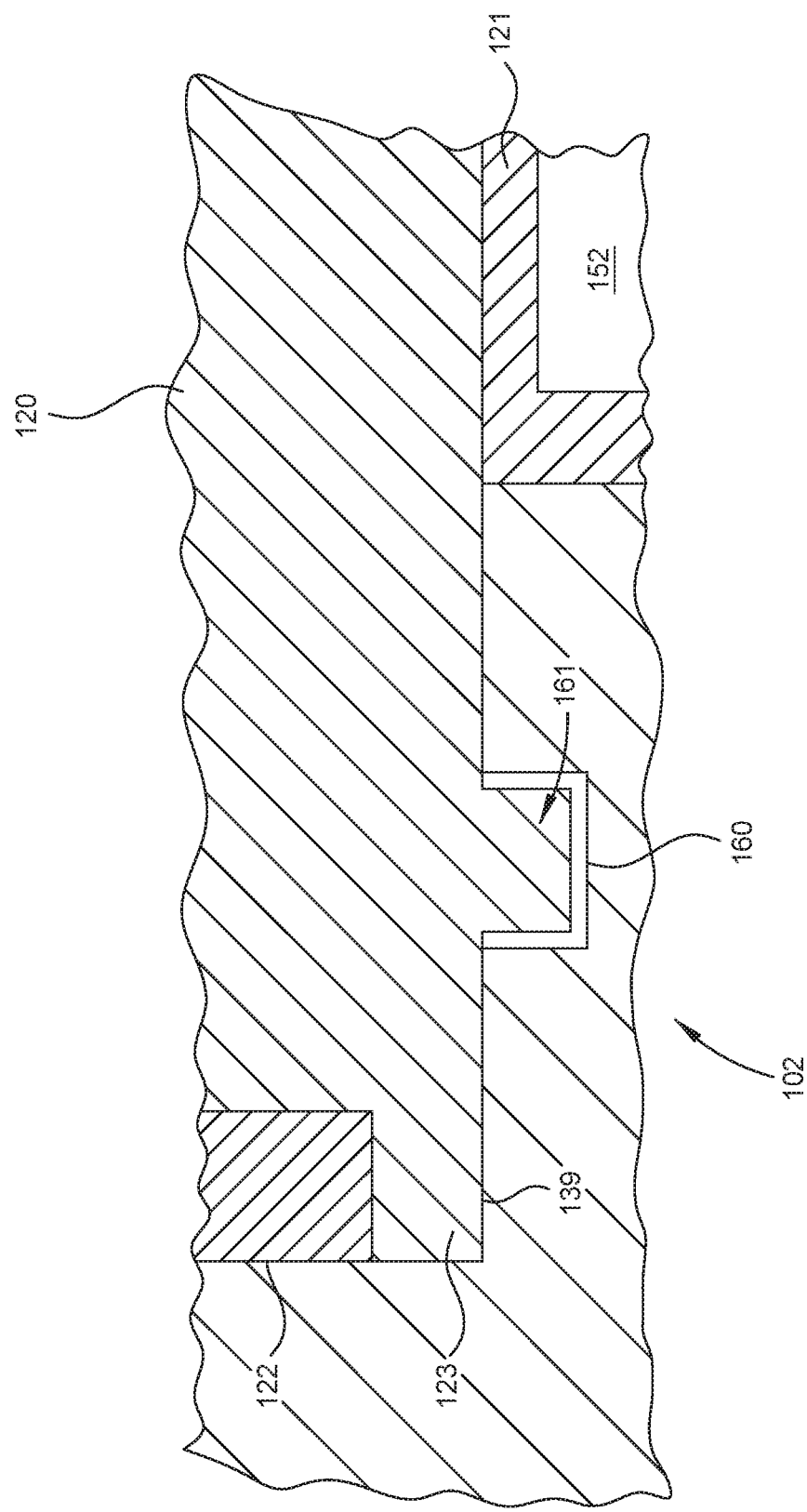
FIG. 1F illustrates a schematic side cross-sectional view of a zoomed-in portion of the ring of FIG. 1E, according to one embodiment.
Figure 1G:
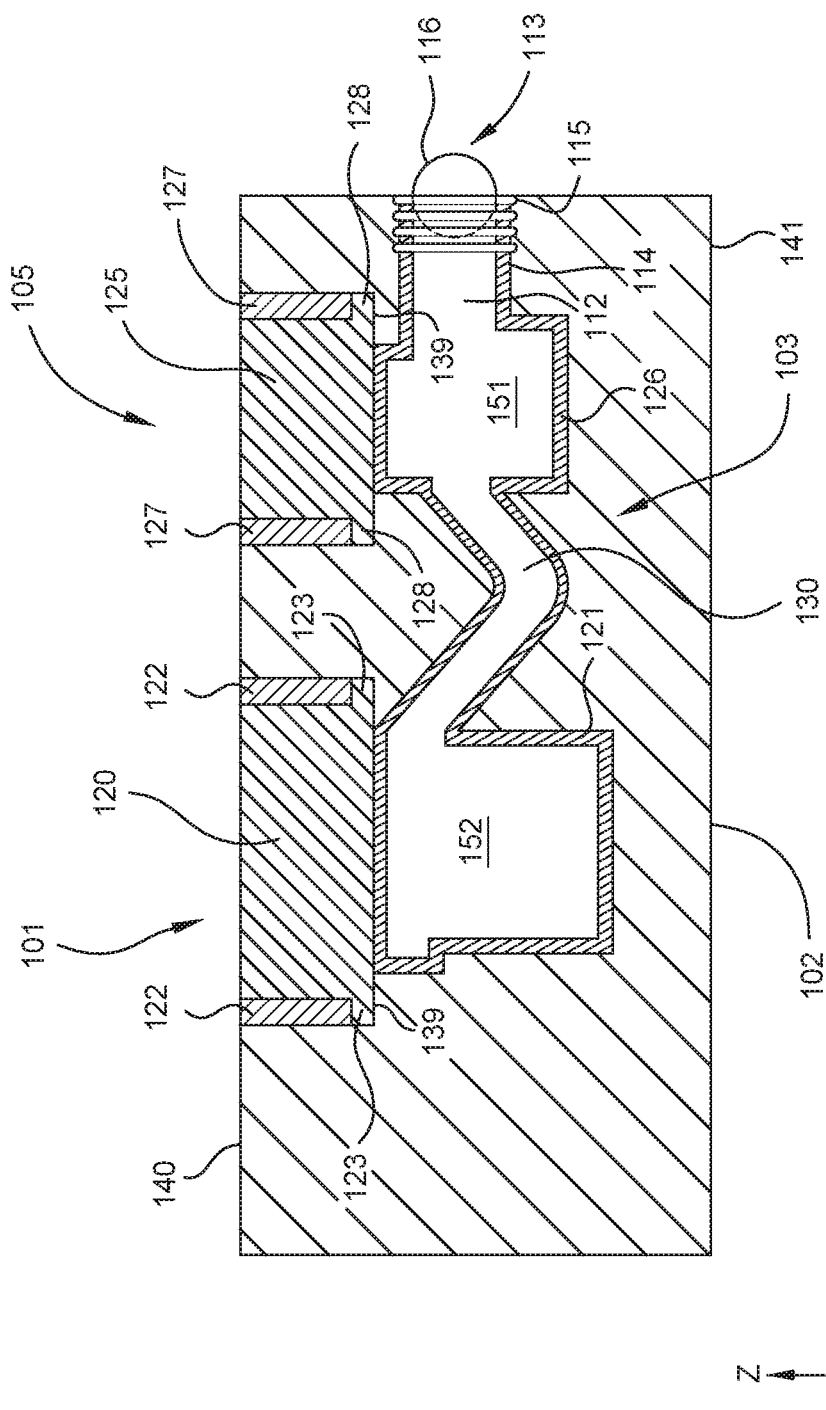
FIG. 1G illustrates a schematic side cross-sectional view of a portion of the ring of FIG. 1A, according to one embodiment.

As shown, the gas flow system 103 includes a gas intake 131, an arc shaped groove 105, a circumferential groove 101, one or more inner channels 130 (FIG. 1B), a plurality of nozzle channels 111 (FIGS. 1B-1D), a plurality of nozzle regions 110 (FIGS. 1B-1D), and an outer channel 112 (FIG. 1G). The arc shaped groove 105 is formed in the body 102 of the ring 100, through the top side 140 (FIG. 1B) of the ring, and does not entirely penetrate through the bottom side 141 of the ring. The arc shaped groove 105 does not entirely circle around the circumference of the ring 100, i.e., the arc shaped groove does not make a complete 360° path. The circumferential groove 101 is formed in the body 102 of the ring 100, through the top side 140 of the ring, and does not entirely penetrate through the bottom side 141 of the ring. In some embodiments, the circumferential groove 101 is a complete circular groove that is formed within the ring 100, i.e., the circumferential groove makes a complete 360° path. In some embodiments, the radius of the circumferential groove 101 is less than the radius of the arc shaped groove 105. The gas intake 131 can be located on the top side 140 of the ring 100, and the gas intake 131 is configured to make a fluid connection with the arc shaped groove 105. Therefore, a process gas 132 that is delivered from a gas delivery system (not shown) and through the gas intake 131 is delivered into the arc shaped groove 105.

Referring to FIG. 1C, in some embodiments, a plurality of nozzle channels 111 are disposed radially throughout the body 102. The inside surface formed at the inner diameter 171 of the ring 100 includes a plurality of nozzle regions 110. The nozzle regions 110 are fluidly connected with the circumferential groove 101 by nozzle channels 111. The nozzle regions 110 allow passage of the process gas 132 to the center of the ring, wherein the substrate 190 is exposed to a process gas during the processing of the substrate 190. In some embodiments, the nozzle regions 110 are spaced around the inside surface of the ring 100, so that an even distribution of the process gas 132 through the nozzle regions is achieved.

Referring to FIG. 1B, in some embodiments, a plurality of inner channels 130 are disposed radially throughout the body 102. In the portion of the ring 100 illustrated in FIG. 1B, an inner channel 130 fluidly connects the arc shaped groove 105 and the circumferential groove 101. The cross section of the arc shaped groove 105 and the circumferential groove 101 can have a variety of shapes. The cross section of the arc shaped groove 105 and the circumferential groove 101 are rectangular slots, according to one embodiment. The cross section of the arc shaped groove 105 and the circumferential groove 101 have one or more ledges 139, according to one embodiment. The ledges 139 prevent unwanted material from falling into the bottom of the arc shaped groove 105 or the bottom of the circumferential groove 101 during the manufacturing process used to form the ring 100, so that unwanted material does not plug the inner channel 130 or the nozzle channel 111 during use. Partially or completely blocked nozzle channels 111 cause issues due to an uneven flow of the process gas 132 to the substrate 190 during processing. The unwanted material includes aluminum (Al), fluoride (F), or both, such as aluminum fluoride ($AlF_3$), according to one embodiment. The unwanted material includes brazing material or alloys provided from the body 102 or the gas supply (not shown), according to one embodiment. The unwanted material includes byproduct created during manufacturing of the ring 100, such as metal chips, according to one embodiment. The gas flow path is formed by the arc shaped groove 105, the one or more inner channels 130, the circumferential groove 101, the nozzle channels 111 and the nozzle regions 110, so that a gas within the arc shaped groove can be delivered to the nozzle regions via the gas flow system 103.

Unwanted debris can form during manufacturing of the ring 100. For example, if the ring includes metal, metal particles can be created during the formation of the gas flow system 103, such as during welding and/or machining processes, and the debris can partially or completely block flow of the process gas 132 through the gas flow system. Separately, depending on the composition of the body 102, the bare arc shaped groove 105 and the bare circumferential groove 101 often react undesirably with the process gas 132, resulting in unwanted formation of debris or residue in the grooves. For example, the body 102 may include a metal that reacts with the process gas 132 to generate reaction byproducts that form debris or residue that flakes off the body 102. This debris or residue can partially or completely obstruct the arc shaped groove 105 or the circumferential groove 101, which results in uneven flow of the process gas 132, thus resulting in uneven flow of process gas, which can cause an uneven growth on the substrate 190 when used in a CVD process.

Therefore, in some embodiments, the arc shaped groove 105 further includes an arc shaped groove coating 126. The arc shaped groove coating 126 is disposed over at least over a portion of the arc shaped groove 105. The arc shaped groove coating 126 protects the arc shaped groove 105 from unwanted chemical reactions with the process gas 132. The process gas includes nitrogen trifluoride ($NF_3$), fluorine gas ($F_2$), silane ($SiH_4$), chlorine ($Cl_2$), ammonia ($NH_3$), argon gas (Ar), or a mixture of the above, according to some embodiments. The arc shaped groove coating 126 also prevents corrosion of the underlying body 102 material, increasing the lifetime of the ring 100. The arc shaped groove coating 126 may include nickel (Ni), Teflon™, polytetrafluoroethylene, or other desirable coating to help protect corrosion of the underlying body 102. The arc shaped groove coating 126 is deposited by electroplating or electroless plating techniques, according to one embodiment. The arc shaped groove coating 126 is an anodized layer of the material of the body 102, according to one embodiment. The body 102 includes aluminum (Al) and the arc shaped groove coating 126 includes aluminum (Al) and oxygen (O), according to one embodiment.

The arc shaped groove coating 126 can be created by a chemical reaction with a liquid or gaseous process chemistry. The process chemistry may include nitrogen (N), such as nitrogen gas ($N_2$). The process chemistry may include at least one of the process gases 132 used during a substrate processing operation. The process chemistry is ionized into a plasma by a radio frequency (RF) source power (not shown), and the plasma reacts with the body 102 to make the arc shaped groove coating 126, according to one embodiment. For example, the body 102 includes Al and the arc shaped groove coating 126 includes Al and N that is formed by use of a formed plasma.

The circumferential groove 101 further includes circumferential groove coating 121. The circumferential groove coating 121 is disposed over at least a portion of the circumferential groove 101. The circumferential groove coating 121 protects the circumferential groove 101 from unwanted chemical reactions with the process gas 132. The process gas can include nitrogen trifluoride ($NF_3$), fluorine gas ($F_2$), silane ($SiH_4$), chlorine gas ($Cl_2$), or ammonia ($NH_3$), or any combination of the above, according to some embodiments. The circumferential groove coating 121 also prevents corrosion of the underlying body 102 material, increasing the lifetime of the ring 100. The circumferential groove coating 121 may include nickel (Ni), Teflon™, polytetrafluoroethylene, or other desirable coating to help protect corrosion of the underlying body 102. The circumferential groove coating 121 is deposited by electroplating or electroless plating techniques, according to one embodiment. The circumferential groove coating 121 is an anodized layer of the material of the body 102, according to one embodiment. If the body 102 includes an Al material, the circumferential groove coating 121 may include aluminum (Al) and oxygen (O), according to one embodiment.

The circumferential groove coating 121 can be created by a chemical reaction with a liquid or gaseous process chemistry. The process chemistry includes nitrogen (N), such as nitrogen gas ($N_2$), according to one embodiment. The process chemistry may include one of the process gases 132 used during a substrate processing operation. The process chemistry is ionized into a plasma by a RF source power (not shown), and the plasma reacts with the body 102 to form the circumferential groove coating 121. For example, the body 102 includes Al and the circumferential groove coating 121 includes Al and N that is formed by use of a formed plasma.

An arc shaped groove sealing element 125 can be disposed over the arc shaped groove 105. The arc shaped groove sealing element 125 seals the arc shaped groove 105 to form an arc internal channel region 151, such that the arc shaped groove is not exposed to the outside environment. This prevents the process gas 132 from leaking out of the ring 100 in an uncontrolled manner, and ensures that the process gas flows in the proper manner through the gas flow system 103. Also, the arc shaped groove sealing element 125 seals and protects the arc shaped groove 105 from unwanted chemical reactions due to byproducts of the process chemistry, for example, volatile byproducts from CVD on the substrate 190. The arc shaped groove sealing element 125 can be made of a metal or a ceramic material. In some embodiments, the arc shaped groove sealing element 125 is formed from the same material that the body 102 is formed from. The arc shaped groove sealing element 125 includes Al, according to one embodiment. The arc shaped groove sealing element 125 may be formed from a 6061 aluminum alloy, according to one embodiment.

The arc shaped groove sealing element 125 can have arc shaped groove tabs 128 on either side of the arc shaped groove sealing element. The arc shaped groove sealing element 125 is fastened and sealed to the body 102 of the ring 100. The arc shaped groove sealing element 125 is welded to the body 102, according to one embodiment. The arc shaped groove sealing element 125 can be electron beam welded to the body 102 using a filler material, such as an arc shaped groove metal portion 127, wherein the arc shaped groove metal portion is disposed between the body 102 of the ring 100 and the space left behind by the arc shaped groove tabs 128. The arc shaped groove metal portion 127 may include an Al material, according to one embodiment. For example, the arc shaped groove metal portion 127 includes a 4000 aluminum alloy.

A circumferential groove sealing element 120 can be disposed over the circumferential groove 101. The circumferential groove sealing element 120 seals the circumferential groove 101, such that the formed circumferential groove internal channel region 152 of the circumferential groove 101 is not exposed to the outside environment. This prevents the process gas 132 from leaking out of the ring 100 in an uncontrolled manner, and ensures that the process gas flows in the proper manner through the formed internal channel region 152 of the gas flow system 103. Also, a surface of the circumferential groove 101 is protected from unwanted chemical reactions due to byproducts of the process chemistry, for example, volatile byproducts from CVD, on the substrate 190 by the groove coating 121. The circumferential groove sealing element 120 can be made of a metal or a ceramic. The circumferential groove sealing element 120 includes Al, such as a 6061 aluminum alloy, according to one embodiment.

The circumferential groove sealing element 120 can have circumferential groove tabs 123 on either side of the circumferential groove sealing element. The circumferential groove sealing element 120 is fastened to the body 102 of the ring 100. The circumferential groove sealing element 120 is welded to the body 102, according to one embodiment. The circumferential groove sealing element 120 can be electron beam welded to the body 102 using a filler material, such as a circumferential groove metal portion 122, wherein the circumferential groove metal portion 122 is disposed between the body 102 of the ring 100 and the space left behind by the circumferential groove tabs 123. The circumferential groove metal portion 122 may include an Al material, according to one embodiment. For example, the circumferential groove metal portion 122 includes a 4000 aluminum alloy.

FIG. 1D illustrates a schematic side cross-sectional view of a portion of the ring 100 using the sectioning line 1D-1D shown in FIG. 1A, according to one embodiment. A nozzle 150 is disposed in the nozzle region 110. In some embodiments, the nozzle 150 is positioned within the nozzle region 110 to further control the direction or speed of the process gas 132 provided from the ring 100 to a substrate 190 during processing. The nozzle 150 can be formed from a ceramic or metal material.

FIG. 1E illustrates a schematic side cross-sectional view of a portion of the ring 100 using the sectioning line 1E-1E shown in FIG. 1A, according to one embodiment. This portion of the ring 100 does not contain nozzles 150, nozzle regions 110, nozzle channels 111, or inner channels 130, and thus is only provided for illustrative purposes.

FIG. 1F illustrates a schematic side cross-sectional view of a zoomed-in portion of the ring 100 shown in FIG. 1E, according to one embodiment. The body 102 can include a depressed portion 160, such that an inset portion 161 of the circumferential groove element 120 is disposed within the depressed portion when the circumferential groove element 120 is disposed within the circumferential groove 101. In some configurations, the body 102 includes a depressed portion 160 formed in the ledges 139 and the circumferential groove element 120 includes a corresponding inset portion 161 that are formed on either side of the circumferential groove 101. The insertion of the inset portion(s) 161 into the depressed portion(s) 160 further prevents unwanted particles or debris from migrating into the enclosed channel region 152, as particles or debris will become trapped in the inset portion, and will not continue to migrate into the channel region. The body 102 can include at least one additional depressed portion within the ledges 139 and a corresponding inset region in the arc shaped groove covering 125 as well. In one example, the body 102 includes a depressed portion 160 formed in the ledges 139 and the arc shaped groove covering 125 includes a corresponding inset portion 161 that are formed on either side of the arc shaped groove 105. Although FIG. 1F illustrates a zoomed-in portion of the ring 100 shown in FIG. 1E, the depressed portion 160 and corresponding inset portion 161 can be located anywhere in the ring, not only the portions where no inner channel 130 is present.

FIG. 1G illustrates a schematic side cross-sectional view of a portion of the ring 100 using the sectioning line 1G-1G shown in FIG. 1A, according to one embodiment. This portion of the ring 100 does not contain nozzles 150, nozzle regions 110, or nozzle channels 111, but the portion of the ring does contain inner channels 130. In order to form the inner channel 130 between enclosed channel regions 151, 152, a hole is drilled or otherwise formed through the side of the body 102 during forming of the gas flow system 103, leaving behind an outer channel 112. The outer channel 112 can be formed in multiple locations around the side of the body 102, such as, for example, six places. The outer channel 112 can include an outer channel coating 114 that is substantially similar to that of the circumferential groove coating 121.

The outer channel 112 needs to be sealed in some manner, to ensure that gas does not flow outside the gas flow system 103 and out of the body 102. Conventional methods use electron beam welding to weld an aluminum plug inside the outer channel 112; however, particles left over from the beam welding material can contaminate the gas flow system 103 of the ring, leaving behind unwanted residue which interferes with the function of the ring 100. Instead, in one embodiment of the present invention, the outer channel 112 can be at least partially filled by a plugging element 113. The material of the plugging element 113 can include a metal, such as, but not limited to, aluminum (Al), aluminum alloy, iron (Fe), or steel, such as Al 6061-TS aluminum alloy. The plugging element 113 includes an expander ball 116 and a ringed body 115. The plugging element 113 is placed in the outer channel 112, and a punch (not shown) drives the expander ball 116 into the ringed body 115, driving the rings of the ringed body into the sides of the outer channel. Although gas can flow into the outer channel 112, the plugging element 113 prevents the gas from escaping out of the body 102, ensuring the integrity of the gas flow system 103.

The plugging element 113 can withstand gas flow pressures of up to about 400 bar. The plugging element 113 does not leave behind any unwanted residue or debris in the gas flow system 103. In addition, the uniformity of the plugging elements 113 help maintain the uniform cosmetic appearance of the ring 100, in contrast to use of conventional electron beam welding, which leaves uneven or unsightly marks on the outside of the body 102. Also, use of a plugging element 113 reduces cost and manpower compared to conventional electron beam (E-beam) welding.

Figure 2:
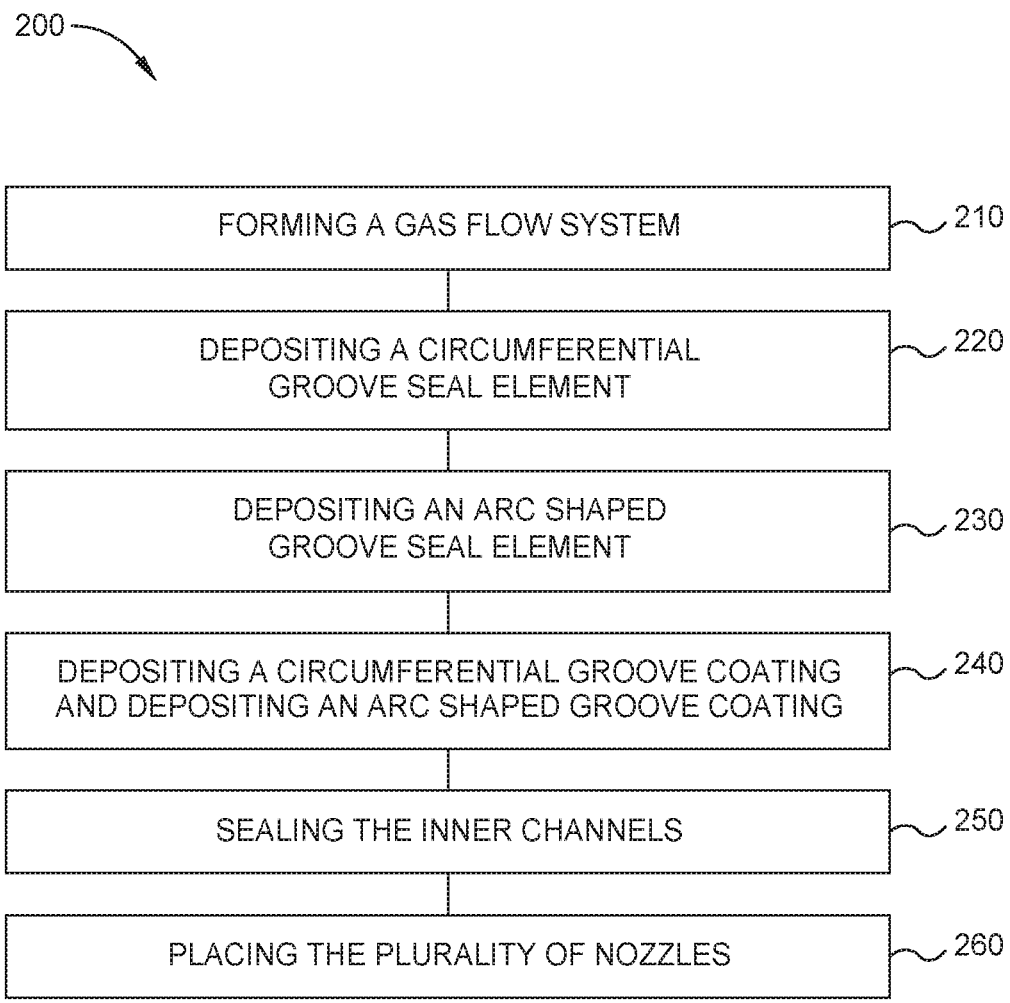
FIG. 2 is a flow diagram of method operations for manufacturing a ring, according to one embodiment.

FIG. 2 is a flow diagram of method 200 operations for manufacturing the ring 100, according to one embodiment. Although the method operations are described in conjunction with FIG. 2, persons skilled in the art will understand that any system configured to perform the method operations, in any order, falls within the scope of the embodiments described herein. The method begins at operation 210, where the gas flow system 103 is formed in the body 102 of the ring 100. The ring 100 in which the gas flow system 103 is formed can be formed by a 3D printing process, according to one embodiment. Alternately, the ring 100 and the gas flow system 103 are formed by one or more machining processes, such as by a computer numerical control (CNC) machining process, according to another embodiment.

At operation 220, the circumferential groove sealing element 120 is disposed within the circumferential groove 101 to form the enclosed channel region 152, which is substantially defined by the surfaces of the circumferential groove 101 and a portion of a lower surface of the circumferential groove sealing element 120. The circumferential groove sealing element 120 is welded to the body 102 by fusing the circumferential groove tabs 123 with the body, so that the circumferential groove sealing element 120 makes a seal with the body 102 of the ring 100. In other embodiments, circumferential groove metal portions 122 are first disposed between the body 102 and the circumferential groove sealing element 120, and then an electron beam welding process is performed to sealably fuse the groove sealing element 120, the circumferential groove metal portions 122 and body 102 together. The circumferential groove metal portions 122 can include a filler metal (i.e., dissimilar metal composition from metal parts to be joined) that promotes the formation of a desirable welded joint(s) between the groove sealing element 120 (e.g., 6000 series Al), the circumferential groove metal portions 122 (e.g., 1000 or 4000 series Al) and body 102 (e.g., 6000 series Al).

At operation 230, the arc shaped groove sealing element 125 is disposed within the arc shaped groove 105 to form the enclosed channel region 151, which is substantially defined by the surfaces of the arc shaped groove 105 and a portion of a lower surface of the arc shaped groove sealing element 125. The arc shaped groove sealing element 125 is welded to the body 102 by fusing the arc shaped groove tabs 128 with the body to form a seal between the arc shaped groove sealing element 125 and the body 102 of the ring 100. In other embodiments, arc shaped groove metal portions 127 are disposed in between the body 102 and the arc shaped groove metal portions 127, followed by an electron beam welding process on the arc shaped groove metal portions 127. The operations 220, 230 can be performed simultaneously, or sequentially. As discussed above, the arc shaped groove metal portions 127 may include a filler metal to promote the formation of a desirable welded joint between the arc shaped groove sealing element 125, the arc shaped groove metal portions 127, and the body 102.

At operation 240, the circumferential groove coating 121 is deposited on at least a portion of the circumferential groove 101, and the arc shaped groove coating 126 is deposited on at least a portion of the arc shaped groove 105. The circumferential groove coating 121 and the arc shaped groove coating 126 may be deposited simultaneously by use of an electroplating or electroless plating process, according to one embodiment. The circumferential groove coating 121 and the arc shaped groove coating 126 may be deposited by flowing a desired electroplating or electroless plating chemistry through the gas flow system 103, and thus coating at least all of the exposed surfaces of the channel regions 151, 152, nozzle channels 111 and one or more inner channels 130.

Alternately, during operation 240, the circumferential groove coating 121 and arc shaped groove coating 126 are deposited by anodizing the material of the body 102, or by a chemical reaction with a desired process chemistry. The circumferential groove coating 121 and the arc shaped groove coating 126 may be deposited by flowing a desired process chemistry through the gas flow system 103, coating at least all of the exposed surfaces of the channel regions 151, 152, nozzle channels 111 and one or more inner channels 130.

At operation 250, the outer channels 112 are sealed by a plugging element 113. The material of the plugging element 113 can include a metal, such as, but not limited to, aluminum, iron, or steel. The plugging element 113 is placed in the outer channel 112, and a punch (not shown) drives the expander ball 116 into the ringed body 115, driving the rings of the ringed body into the sides of the outer channel. Although gas can flow into the outer channel 112, the plugging element 113 prevents the gas from escaping out of the body 102, ensuring the integrity of the gas flow system 103. The plugging element 113 does not leave behind any unwanted residue or debris in the gas flow system 103.

Optionally, at operation 260, the plurality of nozzles 150 are placed within the nozzle regions 110. The nozzle 150 generally includes a component that has an orifice that is configured, due to its internal shape, to control the direction or speed of the process gas 132 exiting the ring 100. The nozzle 150 can be made of a ceramic material or a metal (e.g., aluminum, stainless steel). The orifice formed within the nozzle 150 may include cylindrical and/or converging or diverging orifice configuration(s) that extend from the outlet of a nozzle channel 111 to the inner diameter 171 of the ring 100. The nozzle regions 110 include a threaded feature, and the nozzle 150 is fastened to the body 102 by screwing into the nozzle region, according to one embodiment.

As described above, the ring 100 is manufactured by method operations 200, so that the arc shaped groove 105 is at least partially covered by the arc shaped groove coating 126, and the circumferential groove 101 is at least partially covered by the circumferential groove coating 121. The arc shaped groove coating 126 and the circumferential groove coating 121 prevent unwanted reactions between the body 102 and the process gas 132, preventing the formation of unwanted debris or residue that can partially or completely obstruct the arc shaped groove 105 or the circumferential groove 101, which results in uneven growth on the substrate 190.

The arc shaped groove coating 126 and the circumferential groove coating 121 can be deposited by a variety of processes, and each process results in a coating that helps protect the surface of the groove. The arc shaped groove coating 126 and the circumferential groove coating 121 prevent unwanted reactions between the body 102 and the process gas 132, preventing the formation of unwanted debris or residue that can partially or completely obstruct the arc shaped groove 105 or the circumferential groove 101, which results in an uneven flow of the process gas 132, thus resulting in uneven growth of a film on a substrate 190 (FIG. 1A). In addition, the ledges 139 formed within the body 102 prevent any of the material generated during welding from entering the inner channel regions 151, 152. In some embodiments, it desirable to perform operation 240 after the welding operations performed in operations 220 and 230 are performed in an effort to trap any particles generated and trapped within the channel regions 151, 152 during these welding processes.

Cleaning a Component

Figure 3:
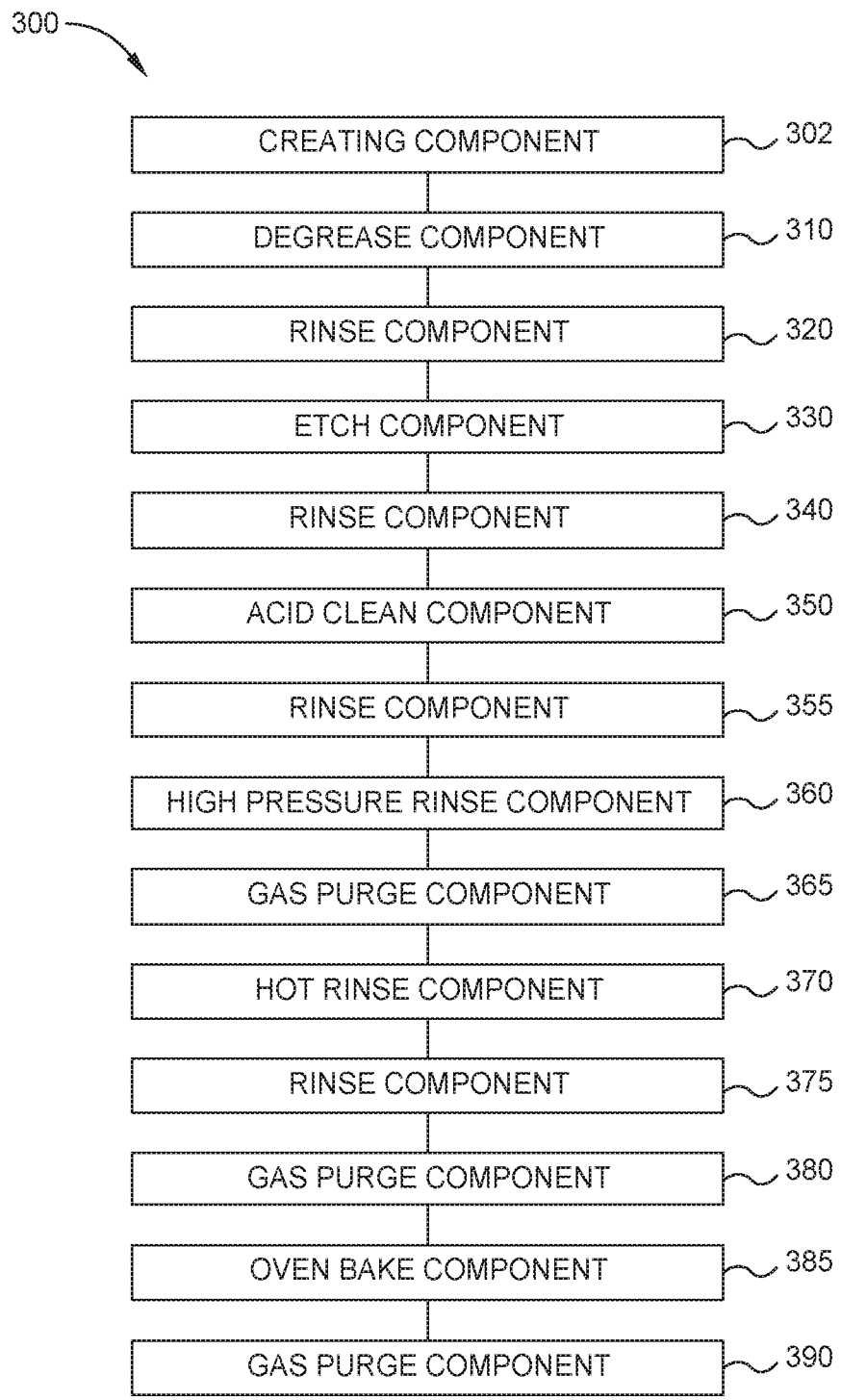
FIG. 3 is a flow diagram of method operations for cleaning a component, according to one embodiment.

FIG. 3 is a flow diagram of method 300 operations for cleaning a component 400, according to one embodiment. Although the method operations are described in conjunction with FIG. 3, persons skilled in the art will understand that any system configured to perform the method operations, in any order, falls within the scope of the embodiments described herein. The method begins at operation 302, where the component 400 is created. The component 400 can be any piece or component of a semiconductor processing chamber, such as, but not limited to, a gas delivery ring, a showerhead, a pedestal, or walls of a chamber. The component 400 is formed by a 3D printing process, according to one embodiment. Alternately, the component 400 is formed by one or more machining processes, such as by a computer numerical control (CNC) machining process, according to another embodiment. The component 400 is the ring 100 described above, and the gas flow system 103 is formed in the body 102 of the ring 100, according to one embodiment.

The operation 302 can include multiple suboperations. For example, when the component 400 is a gas delivery ring 100, operation 302 can include forming a gas flow system 210, depositing a circumferential groove seal element 220, depositing an arc shaped groove seal element 230, depositing a circumferential groove coating and depositing an arc shaped groove coating 240, sealing 250 the outer channels 112 by a plugging element 113, and placing a plurality of nozzles 260, as described above. In addition, the component 400 can be rinsed with a preliminary rinsing chemical after the depositing an arc shaped groove seal element 230, and before the depositing a circumferential groove coating and depositing an arc shaped groove coating 240. The preliminary rinsing chemical can include deionized water, alkaline chemical, or an acid. The preliminary rinsing can include exposing the component to ultrasonic waves. The preliminary rinsing can include an electropolishing suboperation. The preliminary rinsing with a preliminary rinsing chemical helps remove unwanted residue created from forming the component 400, which can interfere with proper functioning of the component. For example, if the component 400 is a ring 100, debris can clog the nozzle regions 110, preventing proper delivery of the process gas.

Figure 4:
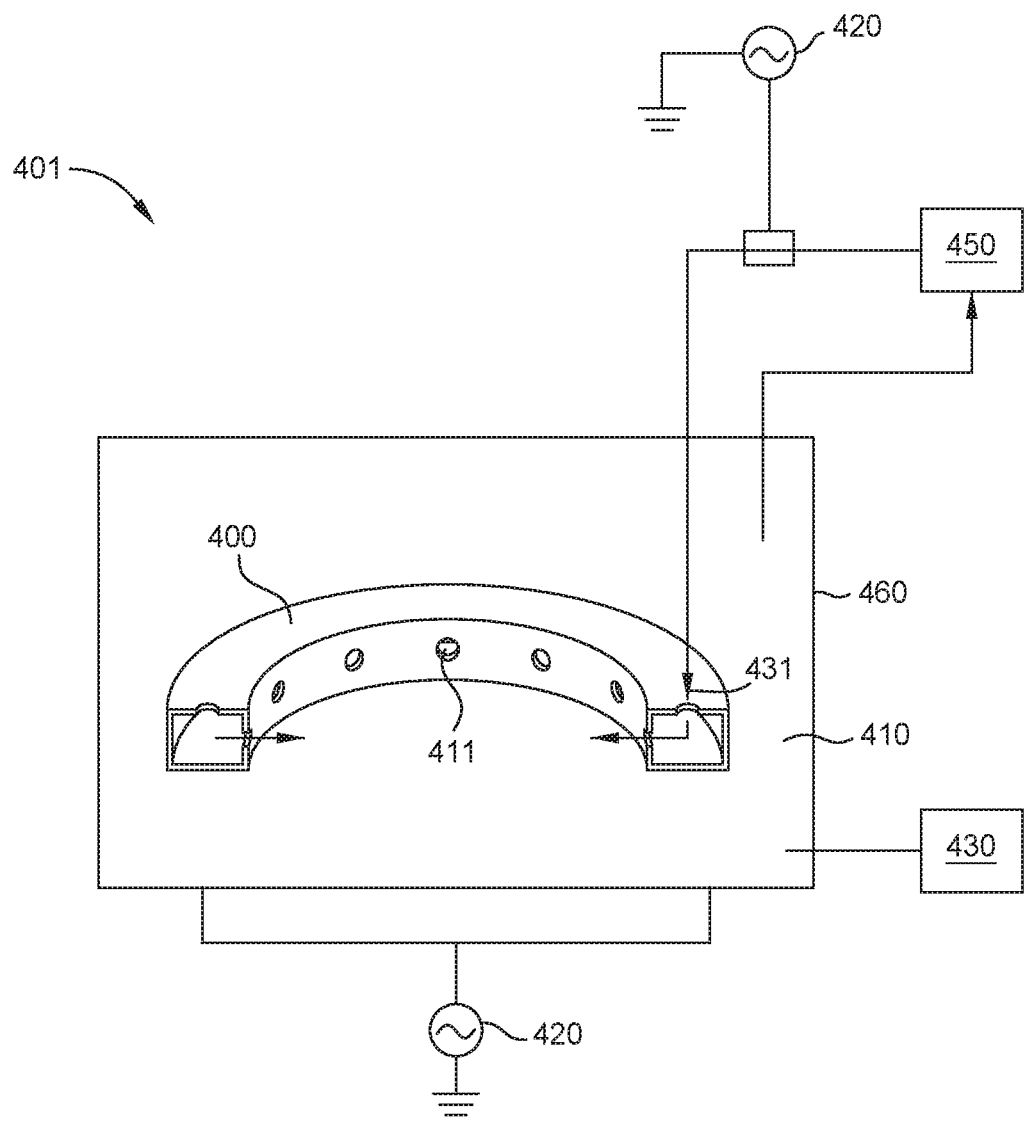
FIG. 4 illustrates a component in a chemical cleaning system, according to one embodiment.

FIG. 4 illustrates a component 400 in a chemical cleaning system 401, according to one embodiment. Although the component 400 is illustrated as a ring in FIG. 4, the component can be any semiconductor processing system component, such as, but not limited to, chamber walls, a showerhead, or a pedestal. As shown, the chemical cleaning system 401 includes a container 460, a chemical solution 410, a pump 450, a heater 430, and one or more ultrasonic cleaners 420. The container 460 contains the chemical solution 410. The component 400 is submerged in the chemical cleaning system 401. The chemical solution 410 varies depending on the specific cleaning operation being performed on the component 400. For example, if the component 400 is undergoing a degreasing operation, the chemical solution 410 includes a degreasing chemical, such as an alkaline chemical. The component 400 can also be rinsed separately from the chemical cleaning system 401, such as in a conventional cleaning station.

The pump 450 is used to flow the chemical solution 410 through and/or around the component 400. The pump 450 provides the chemical solution 410 at a pressure from about 70 psi to about 100 psi. The component 400 includes one or more inlet holes 431, and the component includes one or more outlet holes 411, according to one embodiment. For example, the component 400 is the ring 100, the one or more inlet holes 431 are the gas intake 131, the one or more outlet holes 411 are the nozzle regions 110, and the pump 450 flows the chemical solution 410 into the gas intake, through the gas flow system 103, and out of the nozzle regions. In another example, the component 400 is a showerhead, the one or more inlet holes 431 are the gas intake, the one or more outlet holes 411 are the apertures, and the pump 450 flows the chemical solution 410 into the gas intake and through the apertures. The component 400 is placed in the chemical cleaning system 401, and the pump 450 is not run, according to one embodiment. The movement of the chemical solution 410 by the pump 450 through or over the component 400 provides additional cleaning to the component, as the high pressure and speed of the chemical solution helps to dislodge and remove unwanted debris or residue on or in the component. The pump 450 can be used in any of the following or preceding cleaning operations.

The one or more ultrasonic cleaners 420 are located proximate to the container 460, and the one or more ultrasonic cleaners provide ultrasound to the component 400. The ultrasound provided has a frequency from about 20 kHz to about 400 kHz. The ultrasound sonication power density provided is less than about 25 W/L (100 W/gal). The ultrasound can be provided for about 1 second to about 30 minutes. The ultrasound helps dislodge residue or debris from the component 400, enhancing the cleaning of the component. The one or more ultrasonic cleaners 420 can be used in any of the following or preceding cleaning operations.

In addition, the chemical cleaning system 401 includes a heater 430, which provides heat to the container 460, and thus the heater also provides heat to the chemical solution 410 and the component 400. The heater 430 heats the chemical cleaning system 401 to a temperature of about 20° C. to about 500° C., preferably from about 35° C. to about 75° C. The increased temperature reduces the cleaning time by speeding chemical reactions of the chemical solution 410 and improves the cleaning of the component 400. The heater 430 can be used in any of the following or preceding cleaning operations.

At operation 310, the component 400 is degreased. The degreasing of the component 400 includes submerging the component in the chemical cleaning system 401, and the chemical solution 410 includes a degreasing chemical. The degreasing chemical includes petroleum, chlorine, or an alcohol-based solvent, according to one embodiment. The degreasing chemical includes an alkaline chemical, according to one embodiment. The degreasing chemical includes any commercially available degreaser, such as Enbond®, Oakite®, alkaline detergent, or the equivalent. The degreasing the component 400 removes unwanted residue created during creating the component 302.

In one embodiment, the degreasing chemical includes Enbond®, and the degreasing process is performed for about 20 minutes at a temperature of about 15° C. to about 25° C.

In another embodiment, the degreasing chemical includes Oakite®, and the degreasing process is performed for about 20 minutes at a temperature of about 15° C. to about 25° C.

At operation 320, the component 400 is rinsed, so that unwanted chemical solution 410 remaining on the component is removed from the component. The rinsing chemical includes deionized water, according to one embodiment.

In one embodiment, the rinsing chemical includes deionized water, and the rinsing process is performed for about 5 minutes to about 10 minutes at a temperature of about 40° C. to about 50° C.

At operation 330, the component 400 is etched. The etching of the component 400 includes submerging the component in the chemical cleaning system 401, and the chemical solution 410 includes an etching chemical. The etching chemical includes hydrogen fluoride (HF), buffered hydrogen fluoride (BHF), ammonium fluoride ($NH_4F$), hydrochloric acid (HCl), or any combination of the above, according to one embodiment. The etching chemical can be diluted to any appropriate concentration. The etching the component 400 removes unwanted residue created during creating the component 302.

In one embodiment, the etching chemical includes BHF, and the etching process is performed for about 20 minutes at a temperature of about 50° C. to about 60° C.

At operation 340, the component 400 is rinsed, so that unwanted chemical solution 410 remaining on the component is removed from the component. The process of rinsing the component 400 is similar to that of operation 320 as described above.

At operation 350, the component 400 is acid cleaned. The acid cleaning of the component 400 includes submerging the component in the chemical cleaning system 401, and the chemical solution 410 includes a cleaning acid. The cleaning acid includes a nitrogen-based acid, according to one embodiment. The cleaning acid includes nitric acid ($HNO_3$), nitrous acid ($HNO_2$), or both, according to one embodiment. The acid cleaning of the component 400 removes unwanted residue created during creating the component 302.

In one embodiment, the cleaning acid includes $HNO_3$, and the etching process is performed for about 20 minutes at a temperature of about 15° C. to about 25° C.

At operation 355, the component 400 is rinsed, so that unwanted chemical solution 410 remaining on the component is removed from the component. The process of rinsing the component 400 is similar to that of operation 320 as described above.

At operation 360, the component 400 is high pressure rinsed. The high pressure rinse of the component 400 includes submerging the component in the chemical cleaning system 401, and the chemical solution 410 includes a rinsing chemical. The rinsing chemical includes deionized water, according to one embodiment. The pump 450 increases the pressure of the chemical solution to about 70 psi to about 100 psi. The high pressure rinse of the component 400 removes unwanted chemical solution 410 present from previous operations.

In one embodiment, the chemical solution includes deionized water, and the high pressure rinsing process is performed for about 5 minutes at a temperature of about 15° C. to about 25° C.

At operation 365, a gas purge is performed on the component 400. The gas purge of the component 400 includes supplying a purge gas to the component at a pressure of about 70 psi to about 100 psi. The purge gas includes a nitrogen-containing gas, according to one embodiment. The purge gas includes nitrogen gas ($N_2$), according to one embodiment. The gas purge of the component 400 removes unwanted chemical solution 410 present from previous operations.

In one embodiment, the purge gas includes $N_2$, and the gas purge is performed for about 5 minutes at a temperature of about 15° C. to about 25° C.

At operation 370, the component 400 is high pressure rinsed. The high pressure rinse of the component 400 includes submerging the component in the chemical cleaning system 401, and the chemical solution 410 includes deionized water, according to one embodiment. The pump 450 increases the pressure of the chemical solution to about 70 psi to about 100 psi. An ultrasonic frequency of about 40 Hz to about 400 Hz is provided, a sonication power density of less than about 25 W/L (100 W/gal) is provided, and the temperature of the chemical solution 410 is increased to less than about 50° C. The high pressure rinse of the component 400 removes unwanted chemical solution 410 present from previous operations.

In one embodiment, the chemical solution 410 includes deionized water, and the high pressure rinse is performed for about 5 minutes at a temperature of about 15° C. to about 25° C., with an ultrasonic frequency of about 100 Hz to about 200 Hz, and an ultrasonic power density is supplied of about 15 W/L to about 25 W/L.

At operation 375, the component 400 is rinsed, so that unwanted chemical solution 410 remaining on the component is removed from the component. The process of rinsing the component 400 is similar to that of operation 320 as described above.

At operation 380, a gas purge is performed on the component 400, to remove unwanted particles or residue in or on the component. The gas purge of the component 400 is similar to that of operation 365 as described above.

At operation 385, the component 400 is baked in an annealing chamber (not shown). The baking of the component 400 helps remove unwanted chemical solution 410 remaining on the component. The baking can be performed for about 1 minute to about 5 hours. The baking can be performed at temperatures from about 50° C. to about 400° C. The annealing chamber can include a filter that removes particles larger than a certain radius, such as larger than about 1 µm. The baking of the component 400 can include a baking gas. The baking gas includes nitrogen gas ($N_2$), according to one embodiment.

In one embodiment, the baking gas includes $N_2$, the baking is performed for about 50 minutes to about 70 minutes at a temperature of about 140° C. to about 160° C., and the annealing chamber includes a filter that removes particles larger than about 1 µm.

At operation 390, a gas purge is performed on the component 400. The gas purge of the component 400 is similar to that of operation 365 as described above. The baking of the component 400 and the gas purge of the component can be performed multiple times in succession.

As described above, a method 300 is performed to clean a component 400. Alternating cleaning, purging, and rinsing operations are performed on the component in order to remove debris created during manufacturing of the component 400. A combination of chemistry, increased temperature, submersion in a chemical solution 410, and ultrasound are combined in order to remove debris and residue from the component 400.

The etching and cleaning operations use combination of chemistries to effectively remove residue of different compositions from the outside and inside of the component. Elevated temperatures during cleaning and etching operations accelerate chemical reactions in the chemical solution 410. Ultrasound provided by the one or more ultrasonic cleaners 420 jostle and remove particles and other residue. Purge gases provided in purge operations dislodge particles and residue from the component 400.

While the foregoing is directed to implementations of the present invention, other and further implementations of the invention may be devised without departing from the basic scope thereof, and the scope thereof is determined by the claims that follow.

We claim:

1. A ring, comprising:
   a body; and
   a gas flow system disposed within the body, comprising;
      an arc shaped groove;
      a circumferential groove, wherein the circumferential groove has a smaller radius than a radius of the arc shaped groove;
      a circumferential groove seal element disposed over the circumferential groove to form a first enclosed region;
      a circumferential groove metal portion, wherein the circumferential groove metal portion is disposed between the body and the circumferential groove seal element;
      circumferential seal tabs disposed at a bottom of the circumferential groove seal element, wherein the circumferential seal tabs separate the circumferential groove metal portion from the circumferential groove;
      one or more inner channels that fluidly couple the circumferential groove to the arc shaped groove; and
      a plurality of nozzle regions, wherein the plurality of nozzle regions are disposed at an inner surface of the body, and are each fluidly coupled to the circumferential groove by a respective nozzle channel.

2. The ring of claim 1, wherein the gas flow system further comprises an outer channel, and a plugging element is disposed in the outer channel.

3. The ring of claim 1, wherein a circumferential groove coating is disposed over at least a portion of the circumferential groove, a portion of the circumferential groove seal element, a portion of the circumferential seal tabs, and an arc shaped groove coating is disposed over at least a portion of the arc shaped groove.

4. The ring of claim 3, wherein the circumferential groove coating and the arc shaped groove coating both comprise nickel (Ni).

5. The ring of claim 3, wherein the body comprises aluminum (Al), the circumferential groove coating comprises anodized aluminum, and the arc shaped groove coating comprises anodized aluminum.

6. The ring of claim 1, further comprising:
   an arc shaped groove seal element, wherein the arc shaped groove seal element is disposed over the arc shaped groove to form a second enclosed region, and
   wherein the one or more inner channels are configured to fluidly couple the first enclosed region to the second enclosed region.

7. The ring of claim 6, further comprising an arc shaped groove metal portion, wherein the arc shaped groove metal portion is disposed between the body and the arc shaped groove seal element.

8. The ring of claim 1, wherein the circumferential groove seal element is welded to the body with the circumferential groove metal portion.

9. The ring of claim 1, further comprising a nozzle within each of the plurality of nozzle regions, wherein the nozzle comprises a ceramic material.

10. The ring of claim 7, further comprising arc shaped seal tabs, wherein the arc shaped seal tabs are disposed at a bottom of the arc shaped groove seal element and wherein the arc shaped seal tabs separate the arc shaped groove metal portion from the arc shaped groove.

11. The ring of claim 10, wherein the arc shaped groove seal element is welded to the body with the arc shaped metal portion.

12. A method for manufacturing a ring, comprising:
   forming a gas flow system in a body of the ring, the gas flow system comprising:
      an arc shaped groove;
      a circumferential groove, wherein the circumferential groove has a smaller radius than the radius of the arc shaped groove;
      a circumferential groove seal element disposed over the circumferential groove to form a first enclosed region;
      a circumferential groove metal portion, wherein the circumferential groove metal portion is disposed between the body and the circumferential groove seal element;
      circumferential seal tabs disposed at a bottom of the circumferential groove seal element, wherein the circumferential seal tabs separate the circumferential groove metal portion from the circumferential groove;
      one or more inner channels that fluidly couple the circumferential groove to the arc shaped groove; and
      a plurality of nozzle regions, wherein the plurality of nozzle regions are disposed at an inner surface of the body, and are each fluidly coupled to the circumferential groove by a respective nozzle channel; and depositing a circumferential groove coating and an arc shaped groove coating, wherein the circumferential groove coating is disposed over at least a portion of the circumferential groove, a portion of the circumferential groove seal element, a portion of the circumferential seal tabs, and the arc shaped groove coating is disposed over at least a portion of the arc shaped groove.

13. The method of claim 12, wherein the gas flow gas flow system further comprises an outer channel, the method further comprising sealing the outer channel with a plugging element.

14. The method of claim 12, wherein the circumferential groove coating and the arc shaped groove coating each comprises nickel (Ni).

15. The method of claim 12, wherein the body comprises aluminum (Al), and the depositing the circumferential groove coating and the arc shaped groove coating comprises anodizing a portion of the circumferential groove, the portion of the circumferential groove seal element, the portion of the circumferential seal tabs, and the arc shaped groove.

16. The method of claim 12, further comprising placing a nozzle within each of the plurality of nozzle regions.

17. The method of claim 12, wherein the depositing the circumferential groove coating and the arc shaped groove coating comprises exposing the circumferential groove, the portion of the circumferential groove seal element, the portion of the circumferential seal tabs, and the arc shaped groove to a process chemistry.

18. The method of claim 12, further comprising:
positioning an arc shaped groove seal element over the arc shaped groove to form a second enclosed region;
an arc shaped groove metal portion, wherein the arc shaped groove metal portion is disposed between the body and the arc shaped groove seal element;
arc shaped seal tabs, wherein the arc shaped seal tabs are disposed at a bottom of the arc shaped groove seal element, wherein the arc shaped seal tabs separate the arc shaped groove metal portion from the arc shaped groove; and
wherein the one or more inner channels are configured to fluidly couple the first enclosed region to the second enclosed region, and the nozzle channels are each fluidly coupled to the first enclosed region.

19. The method of claim 18, wherein the circumferential groove seal element is welded to the body with the circumferential groove metal portion and the arc shaped groove seal element is welded to the body with the arc shaped groove metal portion.

\* \* \* \* \*